United States Patent [19]
Lien et al.

[11] Patent Number: 5,128,731
[45] Date of Patent: Jul. 7, 1992

[54] STATIC RANDOM ACCESS MEMORY CELL USING A P/N-MOS TRANSISTORS

[75] Inventors: Chuen-Der Lien, Mountain View; Fu-Chieh Hsu, Saratoga; Jeong Y. Choi, Fremont; Jeng-Jiun Yang, Sunnyvale, all of Calif.

[73] Assignee: Integrated Device Technology, Inc., Santa Clara, Calif.

[21] Appl. No.: 537,848

[22] Filed: Jun. 13, 1990

[51] Int. Cl.[5] ............................................. H01L 29/78
[52] U.S. Cl. ................................. 357/23.5; 357/23.7; 357/42
[58] Field of Search .................... 357/23.7, 23.5, 42

[56] References Cited

U.S. PATENT DOCUMENTS

| | | | |
|---|---|---|---|
| 4,458,261 | 7/1984 | Omura | 357/23.7 |
| 4,555,721 | 11/1985 | Bansal et al. | 357/42 |
| 4,656,731 | 4/1987 | Lam et al. | 357/23.7 |
| 4,772,927 | 9/1988 | Saito et al. | 357/23.7 |
| 4,882,295 | 11/1989 | Czubatyj et al. | 357/23.7 |

FOREIGN PATENT DOCUMENTS

| | | | |
|---|---|---|---|
| 56-158480 | 12/1981 | Japan | 357/23.7 |
| 60-186051 | 9/1985 | Japan | 357/23.7 |
| 61-134059 | 6/1986 | Japan | 357/23.7 |
| 61-184788 | 8/1986 | Japan | 357/23.7 |
| 63-302551 | 12/1988 | Japan | 357/23.7 |

OTHER PUBLICATIONS

IEEE Transaction on Electron Devices, vol. ED-32, No. 2, Feb. 1985, "Characteristics and Three-Dimensional Integration of MOSFET's in Small-Gain LPCVD Polycrystalline Silicon" by Malhi et al.

H. Shichiojo, et al., "Polysilicon Transistors in VLSI MOS Memories," IEDM pp. 228-231, 1984.

T. Yamanaka et al., "A 25 UM2 New Poly-Si PMOS Load (PPL) SRAM Cell having Excellent Soft Error Immunity," IEDM, pp. 48-51, 1984.

M. Ando et al., "A 0.1-uA Standby Current, Ground-Bounce-Immune 1-Mbit CMOS SRAM," IEEE Journal of Solid-State Circuits, vol. 24, No. 6, Dec. 89, pp. 1708-1713.

*Primary Examiner*—Rolf Hille
*Assistant Examiner*—Steven Loke
*Attorney, Agent, or Firm*—Skjerven, Morrill, MacPherson, Franklin & Friel

[57] ABSTRACT

A P/N-MOS transistor having source and drain of opposite semiconductor types is provided. One embodiment of the P/N-MOS transistor has turn-off characteristic similar to a PMOS transistor, and turn-on characteristic similar to a PMOS transistor connected in series with a p-n junction diode. An application of the P/N-MOS transistor is provided in a static random access memory (SRAM) cell. This SRAM cell has density advantage over SRAM cells using polysilicon PMOS transistors as active transistors.

8 Claims, 4 Drawing Sheets

STATIC RANDOM ACCESS MEMORY CELL USING A P/N-MOS TRANSISTORS

FIELD OF THE INVENTION

The present invention relates to the field of polysilicon transistors; and, in particular, relates to the use of polysilicon transistors in static random access memory cells.

BACKGROUND OF THE INVENTION

Polysilicon transistors have been widely used, especially as active load devices in static random access memory (SRAM) cells. Examples of the use of polysilicon transistors may be found in (i) "Polysilicon Transistors in VLSI MOS Memories," by H. Shichijo, et al., IEDM pp.228-31, 1984; (ii) "A 25 UM2 New Poly-Si PMOS Load (PPL) SRAM Cell having Excellent Soft Error Immunity," by T. Yamanaka et al. IEDM, pp.48-51, 1984; and (iii) "a 0.1-uA Standby Current, Ground-Bounce-Immune 1-Mbit CMOS SRAM," by M. Ando et al., IEEE Journal of Solid-State Circuits, Vol. 24, No. 6, December 1989, pp. 1708-13. Each of the above articles is hereby incorporated by reference in its entirety.

FIG. 1 shows a six-transistor CMOS SRAM cell (6-T cell) suitable to be used in a memory array accessible by a two-part address selecting a word line WL and a bit line BL. The transistors in the 6-T cell include two PMOS pull-up transistors (the active load transistors) 102a and 104a, two NMOS transfer transistors 100 and 105, and two NMOS pull-down transistors 101 and 103. The transfer transistors 100 and 105 are controlled by the word line WL, which, when selected, enables a data bit to be read from or written into the 6-T cell on the complementary bit lines BL and $\overline{BL}$.

FIG. 2 shows a four-transistor SRAM cell (4-T cell) suitable for use in a memory array similar to that discussed above for the CMOS 6-T cell shown in FIG. 1. This 4-T cell differs from the CMOS 6-T cell discussed above by having load resistors 102b and 104b in place of the active load transistors 102a and 104a, respectively. The load resistors 102b and 104b are typically resistors made up of high-resistivity polysilicon. One advantage the 4-T cell has over the 6-T cell is its smaller size resulting from having two less transistors. Unlike active load transistors, which are high impedance in the "off" state, and low impedance in the "on" state, load resistors must be designed within a range of values in which the switching speed of the memory cell must be traded-off against the attendant load and leakage currents. Leakage currents in a 4-T cell are always larger than leakage currents in a 6-T cell. In recent years, the requirement of high resistivity in the polysilicon making up the load resistors has led to lower yield, because the higher density in memory chips results in smaller margins between load and leakage currents. Because the 6-T cell has more preferable electrical characteristics, and is easier to manufacture, the 6-T cell design is generally more preferable.

The ability to build three dimensional structures involving multiple layers of polysilicon allows polysilicon transistors, which may be stacked on top of single-crystalline CMOS transistors, to be used as load transistors in a six-transistor SRAM cell. These polysilicon transistors have similar desirable impedance characteristics in their on and off states as the single-crystalline silicon PMOS transistors. T. Yamanaka et al., incorporated by reference in the above, showed a stacked structure including a polysilicon transistor on top of an NMOS transistor, using a triple-polysilicon process. Because of the three-dimensional nature of this structure, the latch-up rules required in a CMOS implementation of the 6-T cell are eliminated, resulting in a smaller implementation than the CMOS counterpart for the same feature size. Schematically, such a 6-T cell will be identical to that shown in FIG. 1, with the understanding that transistors 102a and 104a are polysilicon PMOS transistors, rather than single-crystalline silicon transistors.

FIG. 3 shows an idealized polysilicon PMOS transistor 20. The source 200, drain 202, and channel 201 regions are formed from the same mask level of polysilicon. The source 200 and drain 202 are heavily doped p-type polysilicon and the channel region 201 is preferably lightly doped p-type polysilicon. The gate 203 is formed on another mask level of polysilicon separated by an insulating oxide layer 204.

Since density is an overriding concern in memory designs, it is highly desirable to be able to minimize the cell area.

SUMMARY OF THE INVENTION

In accordance with the present invention, a polysilicon transistor having source and drain regions of different semiconductor types is provided. This polysilicon transistor, called a P/N-MOS transistor, may be used as active load transistors in a static random access memory cell. The P/N-MOS transistor has turn-on characteristics similar to a polysilicon transistor, such as a polysilicon PMOS transistor, connected in series with a p-n junction diode. In one embodiment, the channel region is designed to be fully depleted when gate voltage is high.

The present invention will be more readily understood in light of the following description in conjunction with the accompanying drawings.

DETAILED DESCRIPTION

Figure 1:
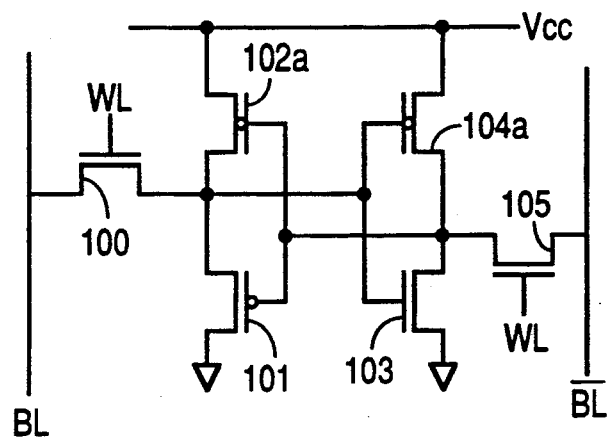
FIG. 1 shows an implementation of a six-transistor SRAM cell with PMOS active load transistors 102a and 104a in the prior art.
Figure 2:
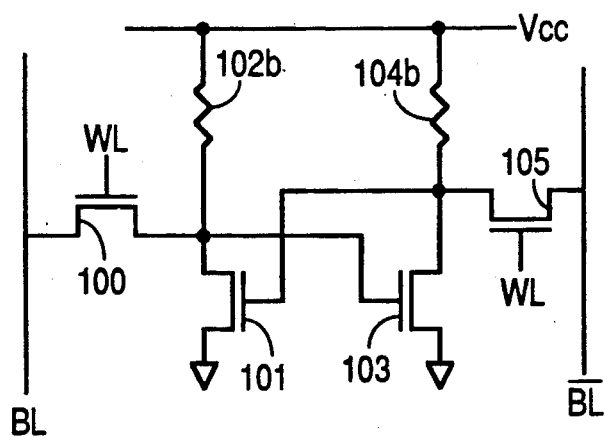
FIG. 2 shows a four-transistor SRAM cell with polysilicon load resistors 102b and 104b in the prior art.
Figure 3:
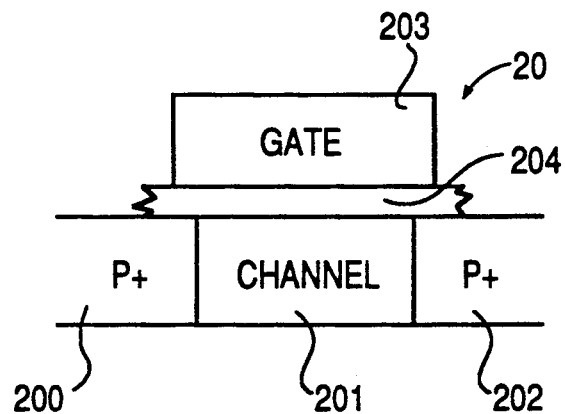
FIG. 3 shows an idealized polysilicon PMOS transistor in the prior art.

An examination of the 6-T cell in FIG. 1 shows that the drains of the active load transistors 102a and 104a are respectively connected to the drains of the pull-down NMOS transistors 101 and 103. Since the drain of the load device 102a is a heavily doped p-type semiconductor region, and the drain of the NMOS transistors 101 is a heavily doped n-type semiconductor regions, the connection between these transistors may form a p-n junction diode in a monolithic implementation, such as the 6-T cell having polysilicon active load transistors discussed above. An analogous connection is found between load device 104a and NMOS transistor 103. An idealized structure of this kind is shown in FIG. 6.

Figure 6:
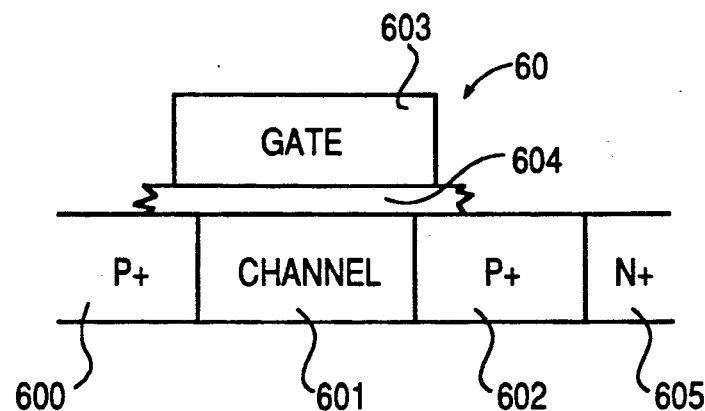
FIG. 6 shows an idealized semiconductor structure comprising a polysilicon PMOS transistor connected in series with a p-n junction diode. This circuit has turn-on characteristic equivalent to the polysilicon P/N-MOS transistor of the present invention.
Figure 9:
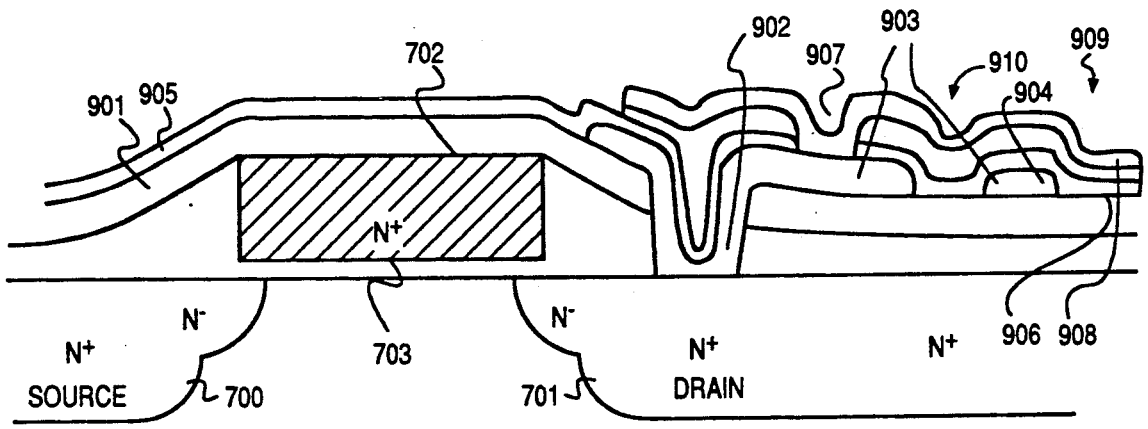
FIG. 9 shows a semiconductor structure formed in a triple-polysilicon fabrication process. This structure also shows a polysilicon P/N-MOS transistor in accordance with the present invention connected to a single-crystalline silicon NMOS transistor.

In FIG. 6, the drain region 602 of polysilicon transistor 60 is shown to be connected to a heavily doped n-type polysilicon interconnect region 605. Since polysilicon is used universally for interconnection, it is common to find interconnect polysilicon regions such as interconnect region 605, connecting a polysilicon transistor such as polysilicon transistor 60, to the drain of an NMOS transistor (See, for example, the cross section of an SRAM cell shown in FIG. 9 of M. Ando's article, incorporated by reference hereinabove). The n-type interconnect 605 may not even exist, if the drain region 602 of the polysilicon transistor is directly adjacent to drain of the NMOS transistor. The structure shown in FIG. 6 has the electrical characteristic of a polysilicon PMOS transistor connected in series with a p-n junction diode.

In accordance with the present invention, a novel transistor, called a P/N-MOS transistor, is provided where it is desired to connect the drain of a p-type polysilicon transistor to the drain of an n-type transistor.

Figure 5:
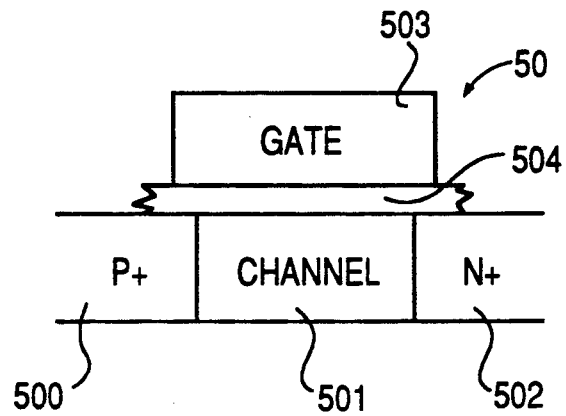
FIG. 5 shows an idealized polysilicon P/N-MOS transistor in accordance with the present invention.

An idealized P/N-MOS transistor 50 is shown in FIG. 5. The P/N-MOS transistor is substantially similar to a polysilicon PMOS transistor, except that the drain region 502 is heavily doped n-type semiconductor, rather than p-type semiconductor in a polysilicon PMOS transistor. The channel region 501 may be lightly doped n-type or p-type semiconductor dependent on the characteristics of the on and off states desired. For the examples of the present invention to be described below, the channel region 501 is lightly doped p-type semiconductor, designed such that, in the "off" state, the channel region 501 is fully depleted, and in the "on" state, the channel surface is p-type semiconductor.

In connecting the drain 502 (n-type region) of the P/N-MOS transistor to a drain of an NMOS transistor, it is found that the operating electrical characteristics the P/N-MOS transistor are the same as for the structure shown in FIG. 6: namely, when the P/N-MOS transistor is turned on, it has the same turn-on characteristic as that of polysilicon PMOS transistor connected in series with a p-n junction diode. The turn-off characteristic of the P/N-MOS transistor is substantially the same as a polysilicon PMOS transistor having high impedance. The P/N-MOS transistor is designed to be totally depleted when in the off-state to prevent both hole and electron currents. The P/N-MOS transistor is therefore especially suited to be used as an active load transistor in a 6-T SRAM cell in place of the polysilicon PMOS transistor because of the higher density achieved by eliminating a p-type drain region. This benefit of higher cell density is accomplished without change in operating characteristic in the resulting 6-T cell.

Figure 4:
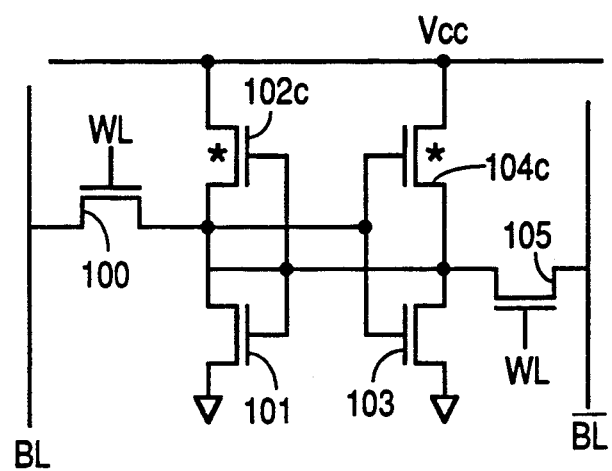
FIG. 4 shows a six-transistor SRAM cell with polysilicon P/N-MOS active load transistors 102c and 104c, in accordance with the present invention.

A 6-T SRAM cell using P/N-MOS transistors as load devices is shown in FIG. 4, where transistors 102c and 104c are P/N-MOS transistors.

Of course, the person skilled in the art will realize from the above description and drawings that the size advantage of the P/N-MOS transistor in connecting the drain region of an NMOS transistor may be realized in a connection of the source regions (p-type semiconductor) of a P/N-MOS transistor and a PMOS transistor. It is, therefore, intended that the connection of the source regions of a P/N-MOS transistor and a PMOS transistor is within the scope of the present invention.

Figure 7:
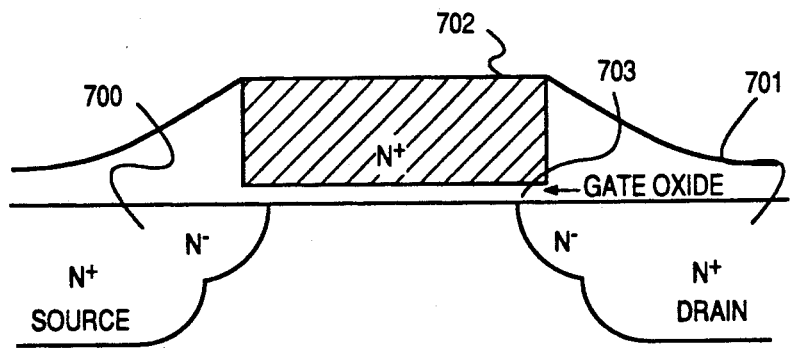
FIG. 7 shows a semiconductor structure formed in a fabrication process, after a single-crystalline silicon NMOS transistor is formed.

P/N-MOS transistors may be fabricated in any manufacturing process featuring two or more levels of polysilicon. Two examples drawn respectively from double-polysilicon and triple-polysilicon processes for fabrication of SRAM cells are provided below. The following description, for either process, begins from the step after single-crystalline silicon CMOS transistors are formed, using any suitable CMOS fabrication technique known in the art. An example of a structure at this starting point is shown in FIG. 7, where it is shown an NMOS transistor having n-type semiconductor source 700 and drain 701 regions, oxide layer 703, and polysilicon gate region 702. As shown, the dopant densities of drain 701 and source 700 at the respective edges of the gate taper to prevent oxide breakdown in the high electric field of those locations. In the double-polysilicon process, as described below, the polysilicon gate region 702 will serve as a common gate region for both this NMOS transistor and the P/N-MOS transistor to be formed.

The following are steps to form an SRAM cell using P/N-MOS active load transistors in a double-polysilicon process. These process steps may be more readily understood by referring to FIG. 8:

1. A thin layer, 300 to 500 angstroms thick, of gate oxide 801 for the P/N-MOS transistor is deposited or grown on top of the structure shown in FIG. 7.

2. A thin layer 802 of amorphous silicon or polysilicon, 300-500 angstroms thick, is deposited on top of the resulting structure of step 1. (This step may be omitted.)

3. Define polysilicon via, e.g. via 803, where it is intended to connect the drain of the P/N-MOS transistor to be formed (e.g. 102c shown in FIG. 4) with the drain (e.g. drain 701) of the underlying NMOS transistor. Vias (not shown) for connection to the gate electrodes of the cross-coupled transistors in the SRAM cell, e.g. 104c and 103 shown in FIG. 4, are also defined at this point.

4. A thin layer 804 of amorphous silicon or polysilicon, 300-500 angstroms thick, is deposited on top of the resulting structure resulting from step 3.

5. A threshold adjustment implant of p-type species is performed on layer 804 (and layer 802). For this purpose, BF$_2$+ ions of energy 30 KeV, and dosage $1.0 \times 10^{12}$ cm$^{-2}$ may be used.

6. A masked implant using p-type species to define the source region 805 of the P/N-MOS transistor is performed. For this purpose, BF$_2$+ ions of energy 30 KeV, and dosage $2.0 \times 10^{14}$ cm$^{-2}$ may be used.

7. A masked implant using n-type species to define the drain regions of the P/N-MOS transistor is performed. For this purpose, $A_s+$ ions of energy 30 KeV, and dosage $1.5 \times 10^{16}$ cm$^{-2}$ may be used.

Figure 8:
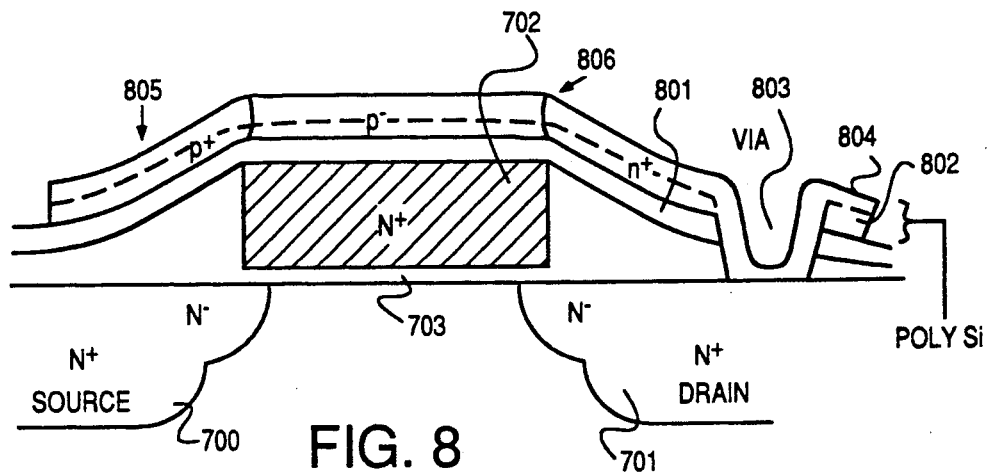
FIG. 8 shows a semiconductor structure formed in a double-polysilicon fabrication process. This structure shows a polysilicon P/N-MOS transistor in accordance with the present invention connected to a single-crystalline silicon NMOS transistor.

8. The active device area of the P/N-MOS transistor and for interconnections areas are defined on layer 804 (and layer 802). The final structure is shown in FIG. 8.

The following are the process steps to form a SRAM cell using P/N-MOS active load transistors in a triple polysilicon process. These process steps may be more readily understood by referring to FIG. 9:

1. Deposit a layer 901 of interpolysilicon dielectric oxide of 1500 angstroms thick, and define vias, such as via 902, to connect drain 701 of the underlying NMOS transistor with the gate electrodes of the cross-coupled transistors, e.g. the drain of NMOS transistor 101 with the gate electrodes of P/N-MOS transistor 104c (to be formed) and NMOS transistor 103 in FIG. 4.

2. A layer of polysilicon 903, 1500 angstroms thick, is deposited, followed by an implant of n-type species into this polysilicon layer 903. For this purpose, $A_s+$ ions of energy 80 KeV and dosage $2.0 \times 10^{15}$ cm$^{-2}$ may be used.

3. The gate region 904 and the interconnection areas are defined on polysilicon layer 903.

4. A layer of thin gate oxide 905, 300–500 angstroms thick, is deposited or grown on top of the structure resulted from step 3.

5. A thin layer 906 of amorphous silicon or polysilicon, 350–500 angstroms thick, is deposited on top of the structure resulted from step 4. (This step may be omitted.)

6. A second set of vias, e.g. via 907, is defined to connect the drain region of the P/N-MOS transistor to be formed, e.g. P/N-MOS transistor 102c in FIG. 4, to the gate electrode of the P/N-MOS transistor to be formed in the crossed-coupled transistors, e.g. P/N-MOS transistor 104c.

7. A second thin layer 908 of amorphous silicon or polysilicon, 350 angstroms thick, is deposited on the structure resulted from step 6.

8. A threshold adjusting implant using p-type species is performed on the polysilicon layer 908 (and layer 906).

For this purpose, $BF_2+$ ions of energy 30 KeV and dosage $1.0 \times 10^{12}$ cm$^{-2}$ may be used.

9. A masked implant to create the source region 909 of the P/N-MOS transistor is performed, using p-type species. For this purpose, $BF_2+$ ions of energy 30 KeV and dosage $2.0 \times 10^{14}$ cm$^{-2}$ may be used.

10. A masked implant to create the drain region 910 of the P/N-MOS transistor is performed, using n-type species. For this purpose, $A_s+$ ions of energy 30 KeV and dosage $2.0 \times 10^{15}$ cm$^{-2}$ may be used.

11. The active device area of the P/N-MOS transistor and the interconnection areas are defined on layer 908 (and layer 906).

The above description of the embodiments of the present invention is intended to be exemplary. The skilled person in the art will be able to derive numerous variations and modifications within the intended scope of the present invention.

We claim:

1. A static random access memory cell comprising:
    first and second polysilicon P/N-MOS transistors, each having a gate, a source region, and a drain region being of a different conductivity as said source region;
    first and second NMOS transistors, each having a gate, a source region and a drain region, wherein said drain region of said first P/N-MOS transistor, said gate of said second NMOS transistor, and said gate of said second P/N-MOS transistor are connected to said drain region of said first NMOS transistor and wherein said drain region of said second P/N-MOS transistor, said gate of said first NMOS transistor, and said gate of said first P/N-MOS transistor are connected to said drain region of said second NMOS transistor.

2. A static random access memory cell as in claim 1, further comprising:
    first and second transfer gates each having input and output leads, said output lead of said first transfer gate connected to said drain of said first polysilicon P/N-MOS transistor and said drain of said first NMOS transistor, and said output lead of said second transfer gate connected to said drain of said second polysilicon P/N-MOS transistor and said drain of said second NMOS transistor.

3. A static random access memory cell as in claim 1 wherein said polysilicon P/N-MOS transistor comprises:
    a control region being said gate of said P/N-MOS transistor for application of a control voltage;
    a channel region separated from said control region by an insulating material, said channel region conducting a current when said control voltage is applied and not conducting a current when said control voltage is not applied;
    a first region being of a first conductivity type and adjacent said channel region, said first region having a lead for application of a first bias voltage; and
    a second region being of a second conductivity type and adjacent said channel region but separated from said first region, said second region having a lead for application of a second bias voltage.

4. A static random access memory cell as in claim 3, wherein said first conductivity type is that of a p-type semiconductor and said second conductivity type is that of a n-type semiconductor.

5. A static random access memory cell as in claim 3, wherein said channel region comprises lightly doped n-type semiconductor.

6. A static random access memory cell as in claim 3, wherein said channel region comprises lightly doped p-type semiconductor.

7. A static random access memory cell as in claim 1, wherein said gate of said first NMOS transistor and said gate of said first P/N-MOS transistor share a common gate structure.

8. A static random access memory cell as in claim 1, wherein said gate of said second NMOS transistor and said gate of said second P/N-MOS transistor share a common gate structure.

* * * * *